United States Patent [19]

Kobayashi et al.

[11] Patent Number: 4,844,832

[45] Date of Patent: Jul. 4, 1989

[54] CONTAINING AN ARYLSULFONIC ACID, A PHENOL AND A NAPHALENIC SOLVENT

[75] Inventors: Masakazu Kobayashi, Kawasaki; Shingo Asaumi, Fujisawa; Akira Yokota, Yamato; Hisashi Nakane, Yokohama, all of Japan

[73] Assignee: Tokyo Ohka Kogyo Co., Ltd., Kawasaki, Japan

[21] Appl. No.: 149,971

[22] Filed: Feb. 3, 1988

Related U.S. Application Data

[63] Continuation of Ser. No. 892,115, Aug. 4, 1986, abandoned.

[30] Foreign Application Priority Data

Aug. 9, 1985 [JP] Japan ............................ 60-174317

[51] Int. Cl.$^4$ .................... C09D 9/00; C09D 9/04; C23D 17/00; H01L 21/465
[52] U.S. Cl. .......................... 252/143; 134/3; 134/38; 252/170; 252/171; 252/558; 252/DIG. 8; 430/329; 430/331
[58] Field of Search ............... 134/3, 38; 252/143, 252/170, 171, 558, DIG. 8; 430/329, 331

[56] References Cited

U.S. PATENT DOCUMENTS

| | | | |
|---|---|---|---|
| 3,582,401 | 6/1971 | Berilla | 134/3 |
| 3,871,929 | 3/1975 | Schevey | 252/171 |
| 4,070,203 | 1/1978 | Neisius | 134/3 |
| 4,165,294 | 8/1979 | Vander Mey | 252/143 |
| 4,165,295 | 8/1979 | Vander Mey | 252/143 |
| 4,215,005 | 7/1980 | Vander Mey | 252/153 |
| 4,221,674 | 9/1980 | Vander Mey | 252/141 |
| 4,242,218 | 12/1980 | Vander Mey | 252/143 |
| 4,395,348 | 7/1983 | Lee | 252/143 |

*Primary Examiner*—Dennis Albrecht
*Attorney, Agent, or Firm*—Hopgood, Calimafde, Kalil, Blaustein & Judlowe

[57] ABSTRACT

The remover solution for photoresist layers comprises: (a) from 30 to 70% by weight of an aromatic hydrocarbon compound or a combination of aromatic hydrocarbon compounds having a flash point of 70° C. or higher containing at least a half amount of a naphthalenic compound selected from the group consisting of naphthalene, methyl naphthalenes and dimethyl naphthalenes; (b) from 5 to 40% by weight of a phenolic compound; and (c) from 10 to 50% by weight of an arylsulfonic acid. The remover solution is effective for a variety of photoresist compositions with less problems in respect to the workers' health and danger of fire and explosion than conventional remover solutions.

7 Claims, No Drawings

CONTAINING AN ARYLSULFONIC ACID, A PHENOL AND A NAPHALENIC SOLVENT

This is a continuation of U.S. patent application Ser. No. 892,115, filed Aug. 4, 1986, now abandoned.

BACKGROUND OF THE INVENTION

The present invention relates to a remover solution for photoresist used in the manufacturing process of semiconductor devices such as ICs, LSIs and the like for removing the positive-or negative-working photoresist layer after fine processing on the semiconductor wafers. More particularly, the invention relates to a remover solution for photoresist having excellent removing power for various kinds of photoresists and having no or little problem of safety in respect of danger of fire and explosion.

To give an outline of the conventional process of manufacturing of semiconductor devices such as ICs, LSIs and the like, a substrate plate, such as a semiconductor silicon wafer, is first provided with a thin film of an oxide, such as silicon oxide, on the surface and then with a uniform coating layer of a photoresist composition. Thereafter, the photoresist layer is exposed to light pattern-wise and then developed to form a patterned photoresist layer which serves as a protecting mask for the subsequent selective etching of the underlying oxide film and other processing procedures. Finally, the patterned photoresist layer is removed completely.

The photoresist layer in the above mentioned last step is removed using a remover solution having a dissolving or decomposing power therefor. Various kinds of remover solutions have been hitherto proposed and actually used including acids and acid mixtures such as concentrated sulfuric acid, fuming sulfuric acid, mixtures of sulfuric acid and hydrogen peroxide and others capable of decomposing the photoresist layer, especially, at an elevated temperature and organic solutions of a surface active agent such as alkylbenzene sulfonic acid dissolved in an organic solvent such as phenols, halogenated hydrocarbons and the like capable of dissolving the photoresist layer.

A serious problem involved in the use of a strong acid such as concentrated sulfuric acid or fuming sulfuric acid as the former class of the remover solutions is of course dangers of the acid to human body and the danger is larger when the acid is used at an elevated temperature as is mostly the case in the use of these acids so that utmost care should be taken to avoid hazards. The remover solutions of the latter class are also not free from the problem of safety due to the toxicity of the solvents such as phenols and halogenated hydrocarbon solvents against human body as well as the danger of fire or explosion. Moreover, such an organic solution is disadvantageous in respect of the environmental pollution when waste solutions are discharged to a public waterway so that the process can be run only with expensive facilities for the disposal of the waste solutions.

Various proposals and attempts have been made of course to solve these problems in the conventional remover solutions. Some of the improved remover solutions so far proposed include mixtures of an alkylbenzene sulfonic acid of which the overall number of carbon atoms in a molecule is 10 to 20 and a non-halogenated aromatic hydrocarbon solvent having a boiling point of 150° C. or higher as disclosed in Japanese Patent Kokai 51-72503, mixtures of a surface-active alkyl aryl sulfonic acid of which the overall number of carbon atoms in a molecule is 10 to 20, a hydrotropic aromatic sulfonic acid having 6 to 9 carbon atoms in a molecule and a non-halogenated aromatic hydrocarbon solvent as disclosed in U.S. Pat. No. 4,165,294 and mixtures of an organic sulfonic acid and an effective amount of 1,2-dihydroxybenzene with admixture of a polar or non-polar organic solvent as disclosed in European Patent EU-A 0119337.

These remover solutions according to the above mentioned proposal, however, are not quite satisfactory in respect of the removing power of photoresist layers although they are free from the disadvantages in respect of the toxicity to workers, danger in working and troubles in the disposal of waste solutions owing to the absence of phenols and halogenated hydrocarbon solvents in their formulation.

SUMMARY OF THE INVENTION

The object of the present invention is to provide an improved remover solution for both of the positive- and negative-working photoresists free from the above described problems and disadvantages in the conventional remover solutions. Namely the invention has an object to provide a remover solution having excellent removing power for photoresist layers without corrosive effect on the layer of metals such as aluminum and having no toxicity against human body and no danger of fire and explosion as well as little problem in connection with disposal of waste solutions.

The remover solution of the invention characteristically comprises a specific aromatic hydrocarbon, a specific phenolic compound and a specific arylsulfonic acid in a specified proportion according to the formulation established as a result of the extensive investigations undertaken by the inventors.

Thus, the remover solution of the invention for photoresist comprises: (a) from 30 to 70% by weight of an aromatic hydrocarbon compound or a combination of aromatic hydrocarbon compounds having a flash point of 70° C. or higher containing at least a half amount of a naphthalenic compound selected from the group consisting of naphthalene, methyl naphthalenes and dimethyl naphthalenes; (b) from 5 to 40% by weight of a phenolic compound; and (c) from 10 to 50% by weight of an arylsulfonic acid as the substantial balance of the components (a) and (b).

DETAILED DESCRIPTION OF THE PREFERRED EMBODIMENTS

As is described in the above given summary, the inventive remover solution is a ternary mixture comprising the components (a), (b) and (c) defined above. The component (a) is an aromatic hydrocarbon compound having a flash point of 70° C. or higher, which contains at least a half amount by weight of a naphthalenic compound selected from the group consisting of naphthalene, methyl naphthalenes and dimethyl naphthalenes. Such an aromatic hydrocarbon compound is exemplified by these naphthalenic compounds alone or mixtures thereof as well as mixtures of at least 50% by weight of these naphthalenic compounds and 50% by weight or less of other aromatic hydrocarbon compounds such as a commercial product available under the trade name of, for example, Solvesso 200 sold by Exxon Co. which is preferable due to the availability and inexpensiveness. This Solvesso 200 is a mixture of aromatic hydrocarbons containing at least about 60% by weight of naphthalene, methyl naphthalenes, dimethyl naphthalenes and ethyl naphthalenes and at least about 10% by weight of tetramethyl benzenes, undecyl benzene and dodecyl benzene. The aromatic hydrocarbon compounds which may be contained in the component (a) supplementing the naphthalenic compounds include tetrahydronaphthalene, dodecyl benzene, didodecyl benzenes, octyl benzene, decyl benzene, isopropyl naphthalenes, diisopropyl naphthalenes and the like.

The inventive remover solution should contain the above defined aromatic hydrocarbon solvent in an amount in the range from 30 to 70% by weight or, preferably, from 50 to 65% by weight.

When the content of the alkyl benzene constituents is excessively large in the component (a), the remover solution would have poor removing power for a negative-working photoresist layer post-baked at a temperature of 160° C. or higher. On the contrary, the inventive remover solution prepared according to the above specified formulation can readily penetrate into and exhibit very high removing power for any negative-working photoresist layers. The situation is about the same for positive-working photoresist layers.

The component (b) formulated in the inventive remover solution is a phenolic compound which may have one or more of phenolic hydroxy groups with or without substituent groups on the aromatic nucleus exemplified by phenol, halogenated phenols, catechol and alkyl phenols, e.g. cresol, xylenol, 4-tert-butyl phenol and nonyl phenol, among which the unsubstituted phenols, halogen-substituted phenols and lower alkyl-substituted phenols, such as phenol, cresol, xylenol, halogenated phenols and catechol, are less preferable due to their relatively large toxicity against human body although they are advantageous in respect of the power of the remover solution formulated therewith for removing photoresist layers. On the other hand, the alkyl phenols having an alkyl substituent group with an increased number of carbon atoms are less toxic against human body though at the sacrifice of the removing power imparted to the remover solution formulated therewith. Taking into consideration the balance between the removing power of the remover solution formulated therewith and the toxicity thereof against human body, therefore, the phenolic component in the inventive remover solution is preferably a mixture of the above named phenolic compounds in an appropriate proportion or an alkyl group of which the overall number of carbon atoms in a molecule is 10 to 20 exemplified by 4-tert-butyl phenol, nonyl phenol and 4-tert-butyl catechol, the latter two being more preferable. These phenolic compounds can be used either singly or as a combination of two kinds or more according to need.

The amount of the above described phenolic compound as the component (b) in the inventive remover solution should be in the range from 5 to 40% by weight or, preferably, from 10 to 20% by weight. When the amount of the phenolic compound is too small, the remover solution would have no sufficient removing power of photoresist layers while, when the amount thereof is too large, the remover solution may have an increased viscosity and cause some troubles in the washing procedure to completely wash the adhering remover solution away from the substrate body after the removing treatment if not to mention the increased toxicity of the remover solution against human body due to the increased content of toxic phenolic compounds.

The component (c) combined with the above described components (a) and (b) in the inventive remover solution is an arylsulfonic acid, which is exemplified by benzene sulfonic acid, toluene sulfonic acid, xylene sulfonic acid, ethylbenzene sulfonic acid, methylethylbenzene sulfonic acid, trimethylbenzene sulfonic acid, propylbenzene sulfonic acid, cumene sulfonic acid, hexylbenzene sulfonic acid, heptylbenzene sulfonic acid, octylbenzene sulfonic acid, decylbenzene sulfonic acid, dodecylbenzene sulfonic acid, tridecylbenzene sulfonic acid, tetradecylbenzene sulfonic acid and the like, of which those having 7 to 20 carbon atoms in a molecule are preferred. They are used either singly or as a combination of two kinds or more according to need.

Among the above named arylsulfonic acids, those having 6 to 9 carbon atoms in a molecule have hydrotropism while those having 12 to 20 carbon atoms in a molecule exhibit surface activity. Although it is preferable to use these two classes of the arylsulfonic acids in combination, quite satisfactory results can be obtained by use of any one of the arylsulfonic acids belonging to the latter class alone. Typical and preferable examples of the arylsulfonic acids include benzene sulfonic acid, toluene sulfonic acid and xylene sulfonic acid belonging to the former class and dodecylbenzene sulfonic acid belonging to the latter class.

The remover solution of the invention should contain the above named arylsulfonic acids in an amount in the range from 10 to 50% by weight or, preferably, from 15 to 30% by weight. When the amount thereof is too small, the remover solution would have insufficient removing power while a remover solution containing the arylsulfonic acid in an excessively large amount may have an increased viscosity possibly to cause some troubles in the step of washing the solution completely away from the substrate surface after the removing process of the photoresist layer therewith.

The remover solution of the invention formulated according to the above given disclosure has very high removing power for negative- and positive-working photoresist layers without the problem of corrosion against layers of metals, e.g. aluminum. Moreover, the inventive remover solution has little problem in respect of the toxicity against human body and environmental pollution by the waste as well as little danger of fire and explosion. Therefore, great advantages are obtained by use thereof in the photolithographic manufacture of semiconductor devices such as ICs, LSIs and the like.

In the following, the remover solution of the invention is illustrated in more detail by way of examples and comparative examples.

EXAMPLES 1 TO 9 AND COMPARATIVE EXAMPLES 1 to 6.

Remover solutions were prepared each according to the formulation indicated in the table to follow and subjected to the evaluation of the performance when used in the procedure of removing of photoresist layers. Thus, a silicon semiconductor wafer was provided with a coating layer of a positive-working or negative-working photoresist (OFPR 800 and OMR 83, respectively, products by Tokyo Ohka Kogyo Co.) in a thickness of 1 μm as dried followed by exposure to light, development and post-baking at 180° C. for 30 minutes to give a photoresist layer. The silicon wafer thus provided with a photoresist layer was dipped in the remover solution kept at 120° C. and taken out after 5 minutes and 15 minutes to examine the removability of the photoresist layer.

The results of the tests are summarized in the Table, in which the removability is indicated by G and NG when the photoresist layer could be removed after 5 minutes of dipping and when the photoresist layer could not be removed even after 15 minutes of dipping, respectively. In the table, the aromatic hydrocarbon solvents, phenolic compounds and arylsulfonic acids formulated in the remover solutions are indicated by the following abridgements.

Aromatic hydrocarbon solvents
  NT: naphthalene
  MN: methyl naphthalene
  DN: dimethyl naphthalene
  TN: tetrahydronaphthalene
  DOB: dodecyl benzene
  DDB: didodecyl benzene
  OB: octyl benzene
  DEB: decyl benzene
  DIN: diisopropyl naphthalene
  SV: Solvesso 200
Phenolic compounds
  PH: phenol
  NP: nonyl phenol
  BP: 4-tert-butyl phenol
  CC: catechol
  BC: 4-tert-butyl catechol
Arylsulfonic acids
  BSA: benzene sulfonic acid
  TSA: toluene sulfonic acid
  XSA: xylene sulfonic acid
  DBSA: dodecylbenzene sulfonic acid

TABLE

| Aromatic hydrocarbon compound, % by wt. | Phenolic compound, % by wt. | Arylsulfonic acid, % by wt. | Removability OMR 83 | Removability OFPR 800 |
|---|---|---|---|---|
| Example | | | | |
| 1  NT, 30; MN, 25 | NP, 20 | DBSA, 15; XSA, 10 | G | G |
| 2  SV, 55 | NP, 20 | DBSA, 15; XSA, 10 | G | G |
| 3  SV, 40 | NP, 20 | DBSA, 40 | G | G |
| 4  NT, 25; MN, 25; DN, 10 | PH, 20 | DBSA, 20 | G | G |
| 5  SV, 60 | PH, 15 | DBSA, 20; TSA, 5 | G | G |
| 6  NT, 30; MN, 35 | BP, 10 | DBSA, 15; XSA, 10 | G | G |
| 7  SV, 60 | BP, 10 | DBSA, 30 | G | G |
| 8  NT, 25; MN, 25; DN, 15 | CC, 10 | DBSA, 15; XSA, 10 | G | G |
| 9  SV, 60 | BC, 10 | DBSA, 20; BSA, 10 | G | G |
| Comparative Example | | | | |
| 1  TN, 60 | NP, 10 | DBSA, 20; XSA, 10 | NG | NG |
| 2  DOB, 60 | NP, 10 | DBSA, 20; XSA, 10 | NG | NG |
| 3  DDB, 60 | NP, 10 | DBSA, 20; XSA, 10 | NG | NG |
| 4  DIN, 60 | NP, 10 | DBSA, 20; XSA, 10 | NG | NG |
| 5  OB, 60 | NP, 10 | DBSA, 20; XSA, 10 | NG | NG |
| 6  DEB, 60 | NP, 10 | DBSA, 20; XSA, 10 | NG | NG |

As is understood from the results shown in the table, the inventive remover solution is as effective as conventional phenol-based remover solutions while replacement of the naphthalenic hydrocarbon compound with other aromatic hydrocarbon compounds in the comparative formulations could only give remover solutions having unacceptable removing power. Although it may be a possible way when a remover solution having acceptable removing power is desired to formulate the remover solution, in place of the naphthalenic hydrocarbons, with other hydrocarbon compounds, such as cumene, p-cymene, trimethylbenzene, diethylbenzene and the like, they have been precluded from the tests for the reason that they have a flash point lower than 70° C. to cause a problem of fire and explosion.

What is claimed is:
1. A remover solution for photoresist consisting of:
  (a) from 30 to 70% by weight or an aromatic hydrocarbon compound or a combination of aromatic hydrocarbon compounds having a flash point of 70° C. or higher containing at least a half amount of a naphthalenic compound selected from the group consisting of naphthalene, methyl naphthalenes and dimethyl naphthalenes;
  (b) from 5 to 40% by weight of a phenolic compound; and
  (c) from 10 to 50% by weight of an arylsulfonic acid.
2. The remover solution as claimed in claim 1 wherein the phenolic compound is selected from the group consisting of phenol, catechol and alkyl phenols having 10 to 20 carbon atoms in a molecule.
3. The remover solution as claimed in claim 2 wherein the alkyl phenol is selected from the group consisting of 4-tert-butyl phenol, 4-tert-butyl catechol and nonyl phenols.
4. The remover solution as claimed in claim 1 wherein the arylsulfonic acid is selected from the group consisting of benzene sulfonic acid and alkylbenzene sulfonic acids having 7 to 20 carbon atoms in a molecule.
5. The remover solution as claimed in claim 4 wherein the alkylbenzene sulfonic acid is dodecylbenzene sulfonic acid.
6. The remover solution as claimed in claim 1 wherein the amounts of the components (a), (b) and (c) are in the ranges from 50 to 65% by weight, from 10 to 20% by weight and from 15 to 30% by weight, respectively.
7. A method for removing a photoresist layer on a substrate surface which comprises dipping the substrate in a remover solution consisting of:
  (a) from 30 to 70% by weight of an aromatic hydrocarbon compound or a combination of aromatic hydrocarbon compounds having a flash point of 70° C. or higher containing at least a half amount of a naphthalenic compound selected from the group consisting of naphthalene, methyl naphthalenes and dimethyl naphthalenes;
  (b) from 5 to 40% by weight of a phenolic compound; and
  (c) from 10 to 50% by weight of an arylsulfonic acid.

* * * * *